(12) United States Patent
Morinaka (10) Patent No.: US 10,931,278 B2
(45) Date of Patent: Feb. 23, 2021

(54) DRIVING CIRCUIT OF SWITCHING TRANSISTOR

(71) Applicant: ROHM CO., LTD., Kyoto (JP)

(72) Inventor: Takafumi Morinaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/883,109

(22) Filed: May 26, 2020

(65) Prior Publication Data

US 2020/0382117 A1  Dec. 3, 2020

(30) Foreign Application Priority Data

May 28, 2019  (JP) .............................. JP2019-099486

(51) Int. Cl.
*H03K 17/687* (2006.01)

(52) U.S. Cl.
CPC ................................ *H03K 17/6872* (2013.01)

(58) Field of Classification Search
CPC ................................................. H03K 17/6872
USPC .................................................. 327/170, 437
See application file for complete search history.

(56) References Cited

U.S. PATENT DOCUMENTS

| | | | | |
|---|---|---|---|---|
| 5,949,254 A * | 9/1999 | Keeth | ............ | H03K 19/018585 326/27 |
| 6,452,428 B1 * | 9/2002 | Mooney | ............... | H03K 17/164 326/30 |
| 7,126,394 B2 * | 10/2006 | Hargan | ................. | H03K 5/01 327/170 |
| 7,151,392 B2 * | 12/2006 | Lee | ....................... | G11C 7/1057 326/82 |
| 7,339,398 B2 * | 3/2008 | Chuang | .............. | H03K 19/0005 326/30 |
| 7,884,647 B2 * | 2/2011 | Kim | ............... | H03K 19/018528 326/82 |
| 7,902,875 B2 * | 3/2011 | Mei | .......................... | H03K 5/12 326/87 |
| 8,018,245 B2 * | 9/2011 | Sohn | ............... | H03K 19/00361 326/26 |
| 10,141,931 B2 * | 11/2018 | Choi | .................. | H03K 19/0005 |
| 2004/0239391 A1 * | 12/2004 | Culler | .............. | H03K 19/00384 327/170 |
| 2005/0001653 A1 * | 1/2005 | Ahmad | ................ | H03K 17/164 326/87 |
| 2007/0008006 A1 * | 1/2007 | Na | ................... | H03K 19/00384 326/83 |

FOREIGN PATENT DOCUMENTS

JP  2012070333 A  4/2012

* cited by examiner

*Primary Examiner* — Ryan Jager
(74) *Attorney, Agent, or Firm* — Cantor Colburn LLP (57) ABSTRACT

The present invention provides a driving circuit of a switching transistor, the driving circuit capable of suppressing an output voltage from changing sharply. A driver circuit includes a first transistor to a fourth transistor and a pre-driver. The pre-driver (i) provides a first gate signal having a negative edge slope smaller than a positive edge slope to the gate of the first transistor, (ii) provides a second gate signal having a positive edge slope smaller than a negative edge slope to the gate of the second transistor, (iii) provides a third gate signal having a positive edge slope smaller than the positive edge slope of the first gate signal to the gate of the third transistor, and (iv) provides a fourth gate signal having a negative edge slope smaller than the negative edge slope of the second gate signal to the gate of the fourth transistor.

20 Claims, 11 Drawing Sheets

DRIVING CIRCUIT OF SWITCHING TRANSISTOR

CROSS REFERENCE FOR RELATED APPLICATIONS

The present invention claims priority under 35 U.S.C. § 119 to Japanese Application No. 2019-099486 filed May 28, 2019, the entire content of which is incorporated herein by reference.

BACKGROUND OF THE INVENTION

Field of the Invention

The present invention relates to a driving circuit of a switching transistor.

Description of the Prior Art

In power conversion devices such as direct-current (DC)/DC converters, inverters or frequency converters, or various applications such as motor driving circuits, a switching circuit including a power transistor and a driving circuit thereof (gate driver) is used.

Figure 1:
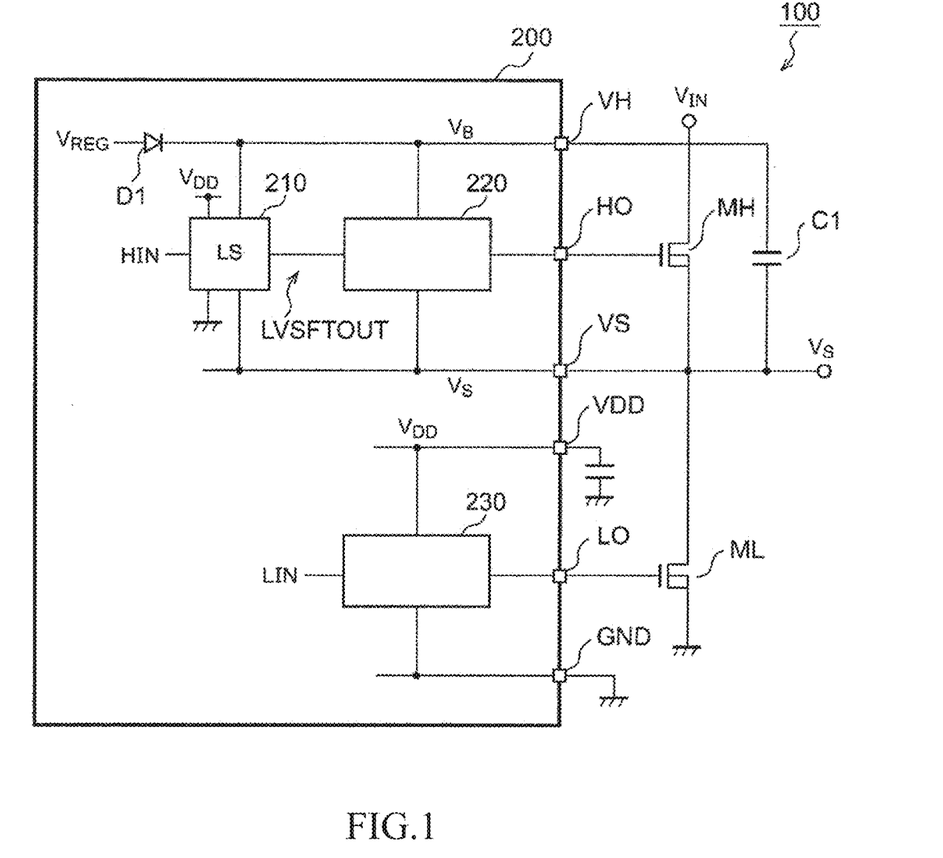
FIG. 1 is a circuit diagram of a switching transistor.

FIG. 1 shows a circuit diagram of a switching circuit. The switching circuit 100R includes a high-side transistor MH, a low-side transistor ML, a bootstrap capacitor C1, and a driving circuit 200.

The driving circuit 200 includes a level shifting circuit 210, a high-side driver 220, a low-side driver 230, and a rectifier element D1.

The rectifier element D1 and an external capacitor C1 jointly form a bootstrap circuit. Using the bootstrap circuit, a voltage VB of a bootstrap (VB) line is kept to be a predetermined voltage range $\Delta V(\approx VREG)$ higher than a voltage VS of a switching (VS) line.

The level shifting circuit 210 shifts a high-side pulse HIN of a logic level with VDD set as high and 0 V set as low to a control signal LVSFTOUT with VB set as high and VS set as low. The high-side driver 220 drives the high-side transistor MH according to the control signal LVSFTOUT.

The low-side driver 230 drives the low-side transistor MH according to a low-side pulse LIN.

Figure 2:
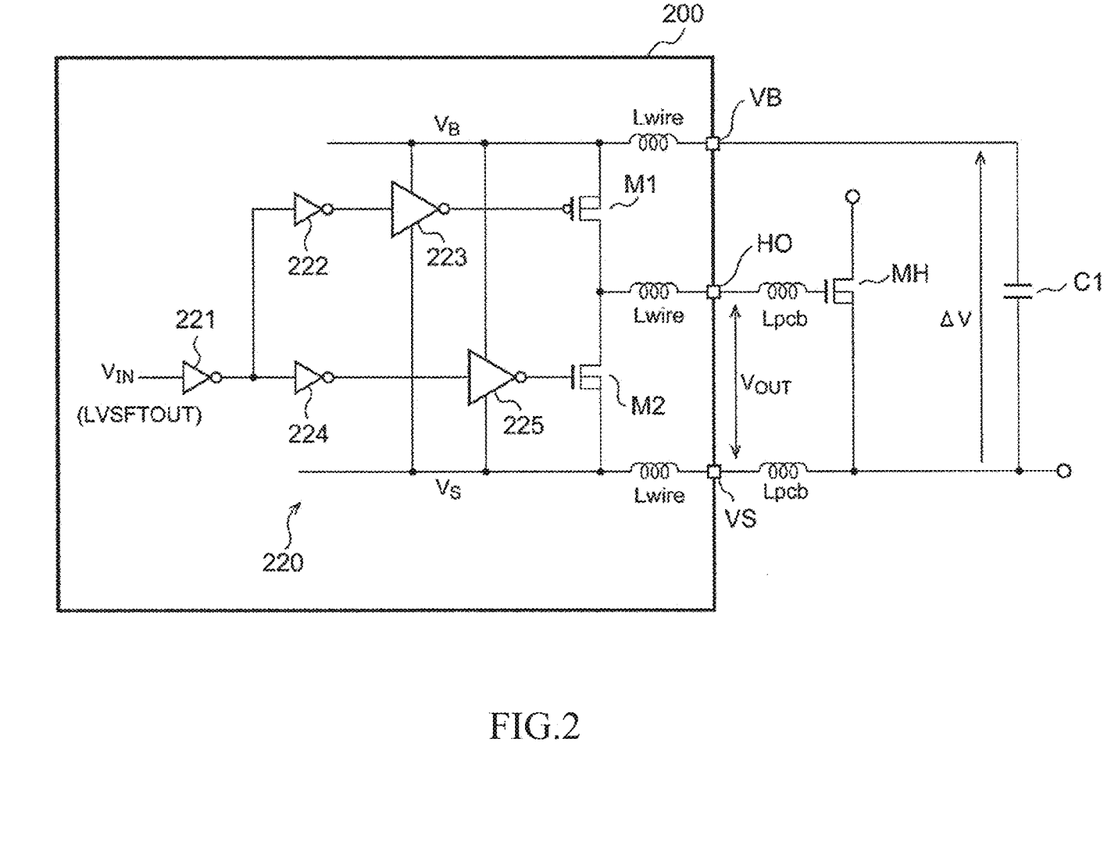
FIG. 2 is a circuit diagram of a configuration example of a high-side driver.

FIG. 2 shows a circuit diagram of a configuration example of the high-side driver 220. The high-side driver 220 includes transistors M1 and M2, and inverters 221 to 225.

Figure 3:
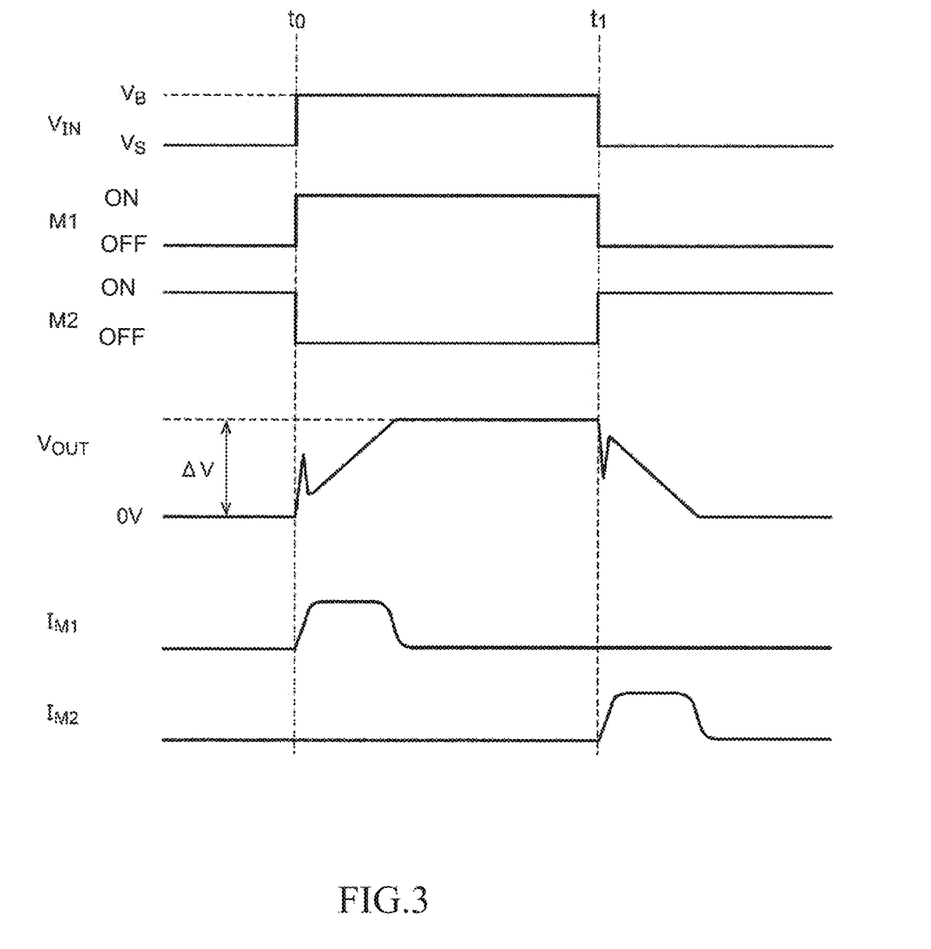
FIG. 3 is a waveform diagram of the operation of a high-side driver in FIG. 2.

FIG. 3 shows a waveform diagram of the operation of the high-side driver 220. Before a timing t0, the input voltage VIN is low (VS), the first transistor M1 is turned off, the second transistor M2 is turned on, and a gate-source voltage VOUT of the high-side transistor MH is zero. Once the input voltage VIN becomes high (VB) at the timing t0, the first transistor M1 is turned on, the second transistor M2 is turned off, a current IM1 is provided through the first transistor M1 to a gate capacitor of the high-side transistor MH, the gate-source voltage VOUT rises, and the high-side transistor MH is turned on.

Once the input voltage VIN becomes low (VS) at a timing t1, the first transistor M1 is turned off, the second transistor M2 is turned on, a current IM2 is extracted through the second transistor M2 from the gate capacitor of the high-side transistor M2, the gate-source voltage VOUT drops, and the high-side transistor MH is turned off.

PRIOR ART DOCUMENTS

Patent Publication

[Patent document 1] Japan Patent Publication No. 2012-70333

SUMMARY OF THE INVENTION

Problems to be Solved by the Invention

As shown in FIG. 2, the driving circuit 200 contains a parasitic inductance Lwire caused by bonding wires or vias, or a parasitic inductance Lpcb caused by routings on a printed substrate. Influenced by these parasitic inductances, as shown in FIG. 3, sometimes at the timings t0 and t1 at which the high-side transistor MH is turned on and turned off, the output voltage VOUT of the high-side driver 200, that is, the gate voltage of the switching transistor, changes sharply.

The present invention is completed in view of the task above, and an exemplary object of an embodiment thereof is to provide a driving circuit capable of suppressing an output voltage from changing sharply.

[Technical Means for Solving the Problem]

A driving circuit of a switching transistor is provided according to an embodiment of the present invention. The driving circuit includes: an output pin, connected to a control terminal of the switching transistor; a high-side line; a low-sideline, a p-channel first transistor, disposed between the high-side line and the output pin; an n-channel second transistor, disposed between the output pin and the low-side line; a p-channel third transistor, disposed between the high-side line and the output pin, having a size smaller than that of the first transistor; an n-channel fourth transistor, disposed between the output pin and the low-side line, having a size smaller than that of the second transistor; and a pre-driver, (i) providing a first gate signal having a negative edge slope smaller than a positive edge slope to a gate of the first transistor, (ii) providing a second gate signal having a positive edge slope smaller than a negative edge slope to a gate of the second transistor, (iii) providing a third gate signal having a positive edge slope smaller than the positive edge slope of the first gate signal to a gate of the third transistor, and (iv) providing a fourth gate signal having a negative edge slope smaller than the negative edge slope of the second gate signal to a gate of the fourth transistor.

According to the embodiment, turn-on speeds of the first transistor and the second transistor are reduced by moderating the waveforms of the first gate signal and the second gate signal, hence limiting the slope of the current that charges/discharges of the gate capacitor of the switching transistor, and accordingly suppressing the output voltage from changing sharply.

However, a high-impedance period in which both the first transistor and the second transistor are turned off is generated due to the delayed turning on of the first transistor and the second transistor. Before charging or discharging of the gate capacitor of the switching transistor ends, if both the first transistor and the second transistor are turned off, the current flowing to the parasitic inductance is abruptly cut off, such that oscillation is caused in the voltage of the high-side line or the low-side line. Thus, by additionally providing the third transistor and the fourth transistor, the current is enabled to flow to a path including the third transistor and the fourth transistor in a dead time period in which the first transistor and the second transistor are turned off, hence suppressing the oscillation of the voltage of the high-side line or the low-side line.

A driving circuit of a switching transistor is provided according to another embodiment of the present invention. The driving circuit includes: an output pin, connected to a control terminal of the switching transistor; a high-side line; a low-side line; a p-channel first transistor, disposed between the high-side line and the output pin; an n-channel second transistor, disposed between the output pin and the low-side line; a p-channel third transistor, disposed between the high-side line and the output pin, having a size smaller than that of the first transistor; an n-channel fourth transistor, disposed between the output pin and the low-side line, having a size smaller than that of the second transistor; and a pre-driver, providing a first gate signal to a fourth gate signal to the first transistor to the fourth transistor. The pre-driver generates the first gate signal by way of controlling a turn-on time of the first transistor to be longer than a turn-off time thereof, generates the second gate signal by way of controlling a turn-on time of the second transistor to be longer than a turn-off time thereof, and generates the third gate signal and the fourth gate signal by way of turning on the third transistor and the fourth transistor in a period in which both the first transistor and the second transistor are turned off.

The first gate signal and the fourth gate signal may be common, and the second gate signal and the third gate signal may be common. Thus, the circuit configuration may be simplified.

The pre-driver may further include: a first driving unit, receiving a pulse signal, generating a first gate signal that uses a first edge of the pulse signal as trigger to drop by a first slope and using a second edge of the pulse signal as trigger to rise by a second slope larger than the first slope; and a second driving unit, generating a second gate signal that uses the first edge of the pulse signal as trigger to drop by a third slope and using the second edge of the pulse signal as trigger to rise by a fourth slope smaller than the third slope.

The first driving unit may include a first complementary metal-oxide-semiconductor (CMOS) inverter disposed on an output section thereof, wherein a p-channel metal-oxide-semiconductor (PMOS) transistor of the first CMOS inverter has a size larger than that of an n-channel metal-oxide-semiconductor (NMOS) transistor of the first CMOS inverter; the second driving unit may include a second CMOS inverter disposed on an output section thereof, wherein a p-channel metal-oxide-semiconductor (PMOS) transistor of the second CMOS inverter has a size smaller than that of the NMOS transistor of the second CMOS inverter.

The third transistor may be smaller than 1/3 of the first transistor, and the fourth transistor may be smaller than 1/3 of the second transistor.

The pre-driver may include: a first driving unit, generating the first gate signal; a second driving unit, generating the second gate signal; a third driving unit, generating the third gate signal; and a fourth driving unit, generating the fourth gate signal.

Further, any combination of the components above or equivalent substitutions of the components of the present invention or expressions in methods, devices and systems, are also considered valid embodiments of the present invention.

Effects of the Invention

The gate voltage of a switching transistor may be suppressed from sharp changes according to an embodiment of the present invention.

DETAILED DESCRIPTION OF THE EMBODIMENTS

Embodiments

Details of the present invention are given in preferred embodiments with the accompanying drawings below. The same or equivalent constituent elements, components, or processes depicted in the drawings are represented by the same denotations, and repeated description is appropriately omitted. Further, the embodiments are examples that do not form limitations to the present invention, and all features stated in the embodiments and any combination thereof are not necessarily essential features of the present invention.

In the description, "a state of component A being connected to component B" includes, in addition to a situation where component A and component B are directly physically connected, a situation where component A and component B are indirectly connected to other components, in a way that no substantial influences are produced on the electrical connection state thereof or no functions and effects produced thereby in combination are compromised.

Similarly, "a state of component C being arranged between component A and component B" includes, in addition to a situation where component A and component C or component B and component C are directly connected, a situation where said components are connected to other components, in a way that no substantial influences are produced on the electrical connection state thereof or no functions and effects produced thereby in combination are compromised.

Further, an expression "signal A (voltage, current) corresponds to signal B (voltage, current)" means that signal A and signal B are related, and more specifically, it means (i) signal A is signal B, (ii), signal A is directly proportional to signal B, (iii) signal A is obtained by level shifting signal B, (iv) signal A is obtained by amplifying signal B, (v) signal A is obtained by inverting signal B, or (vi) any combination of the above. It should be understood that the range of "corresponding" is defined according to the types and purposes of signals A and B.

Figure 4:
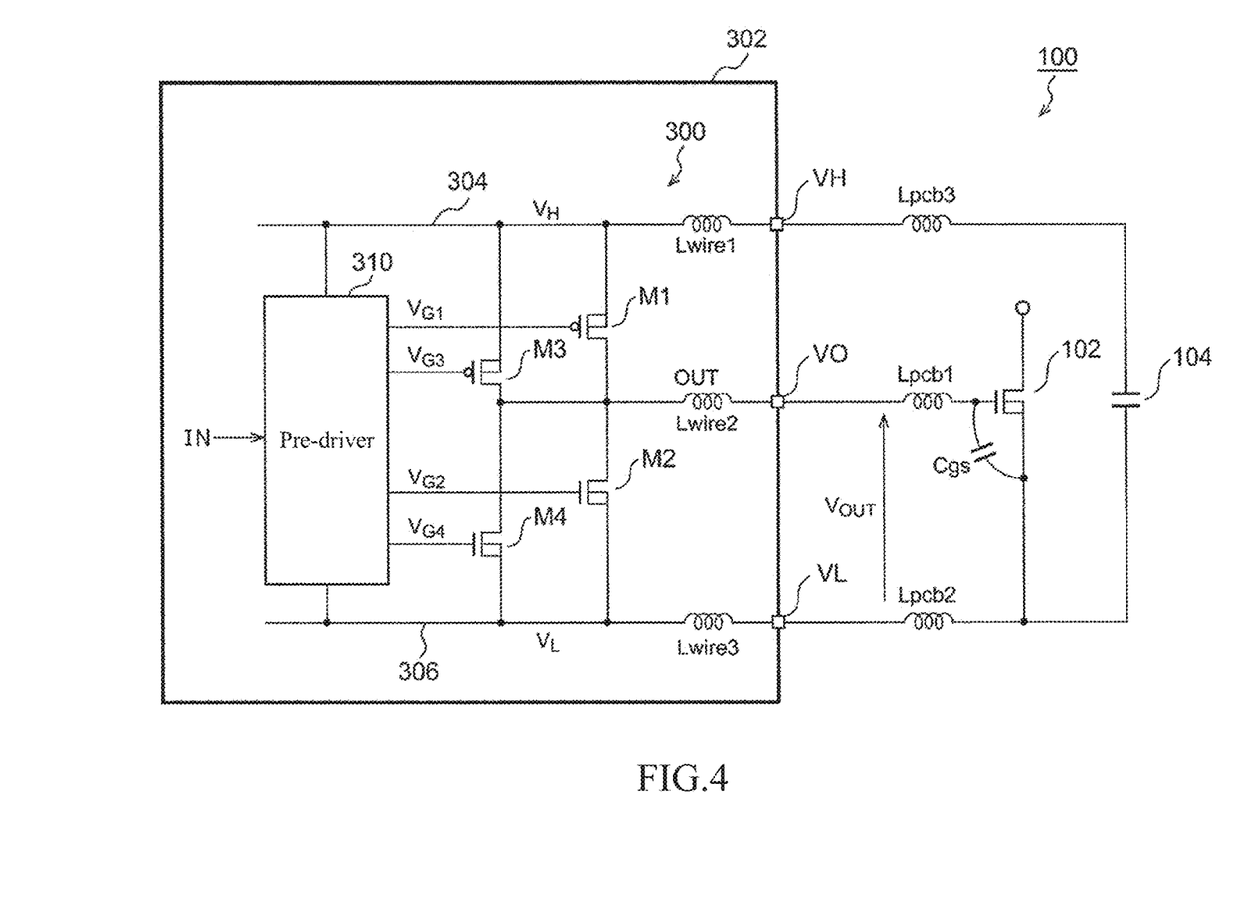
FIG. 4 is a circuit diagram of a switch circuit including a driving circuit according to an embodiment.

FIG. 4 shows a circuit diagram of a switching circuit 100 including a driving circuit 300 according to an embodiment. The switching circuit 100 includes a switching transistor 102 and the driving circuit 300. The switching circuit 102 is equivalent to the high-side transistor MH or the low-side transistor ML in FIG. 1, and the driving circuit 300 is equivalent to the high-side driver 220 or the low-side driver 230 in FIG. 1. The switching transistor 102 is not limited to being a specific type, and examples thereof include a metal-oxide-semiconductor field-effect transistor (MOSFET), an insulated-gate bipolar transistor (IGBT), and a-high-electron mobility transistor (HEMT).

The driving circuit 300 is integrated on a semiconductor device 302. The semiconductor device 302 includes a high-side pin VH, an output pin VO, and a low-side pin VL. The pin VO is connected to a control terminal (i.e., the gate or the base) of the switching transistor 102 of a driving target. When the switching transistor 102 is a high-side transistor, the pin VH, the pin VO and the pin VL have a corresponding relationship with a pin VB, a pin HO and a pin VL in FIG. 1. When the switching transistor 102 is a low-side transistor, the pin VH, the pin VO and the pin VL have a corresponding relationship with a pin VDD, a pin LO and a pin GND in FIG. 1. A capacitor 104 is connected between the pin VH and the pin VL. When the switching transistor 102 is a high-side transistor, the capacitor 104 is a bootstrap capacitor; when the switching transistor 102 is a low-side transistor, the capacitor 104 is a smoothing capacitor for power supply.

The driving circuit 300 includes a first transistor M1, a second transistor M2, a third transistor M3, a fourth transistor M4, and a pre-driver 310.

The high-side line 304 is connected to the pin VH, and the low-side line 306 is connected to the pin VL. The driving circuit 300 sets the voltage VH of the high-side line and the voltage VL of the low-side line as power to drive the switching transistor 102.

The first transistor M1 is a p-channel metal-oxide-semiconductor field-effect transistor (MOSFET), and is disposed between the high-side line 304 and the output pin VO. The second transistor M2 is an n-channel MOSFET, and is disposed between the output pin VO and the low-side line 306.

The third transistor M3 is between the high-side line 304 and the output pin VO, and is disposed in parallel to the first transistor M1. The third transistor M3 has a size smaller than that of the first transistor M1 (W/L, where W is the gate width and L is the gate width), and thus has a turn-on resistance larger than that of the first transistor M1. For example, the third transistor M3 has a size preferably smaller than ⅓ of that of the first transistor M1, and may be set to about ¼.

The fourth transistor M4 is disposed in parallel to the second transistor M2 between the output pin VO and the low-side line 306. The fourth transistor M4 has a size smaller than that of the second transistor M2, and thus has a turn-on resistance larger than that of the second transistor M2. For example, the fourth transistor M4 has a size preferably smaller than ⅓ of that of the second transistor M2, and may be set to about ¼.

The pre-driver 310 generates, according to the input signal VIN, a first gate signal VG1 to a fourth gate signal VG4 to be applied to the gates of the first transistor M1 to the fourth transistor M4, to control turning on and turning off of the first transistor M1 to the fourth transistor M4.

The pre-driver 310 generates the first gate signal VG1 by way of controlling a turn-on time TTURN_ON1 of the first transistor M1 to be longer than a turn-off time TTURN_OFF1 thereof. Further, the pre-driver 310 generates the second gate signal VG2 by way of controlling a turn-on time TTURN_ON2 of the second transistor M2 to be longer than a turn-off time TTURN_OFF2 thereof.

Further, the predetermined 310 generates the third gate signal VG3 and the fourth gate signal VG4 by way of turning on the third transistor M3 and the fourth transistor M4 in a period in which both the first transistor M1 and the second transistor M2 are turned off.

In this embodiment, the pre-driver 310 (i) provides the first gate signal VG1 having a negative edge (rear edge, or falling edge) slope smaller than a positive edge (front edge or rising edge) slope to the gate of the first transistor M1, (ii) provides the second gate signal VG2 having a positive edge slope smaller than a negative edge slope to the gate of the second transistor M2, (iii) provides the third gate signal VG3 having a positive edge slope smaller than the positive edge slope of the first gate signal VG1 to the gate of the third transistor M3, and (iv) provides the fourth gate signal VG4 having a negative edge slope smaller than the negative edge slope of the second gate signal VG2 to the gate of the fourth transistor M4.

In this embodiment, the first gate signal VG1 and the fourth gate signal VG4 are common, and the second gate signal VG2 and the third gate signal VG3 are common.

Figure 5:
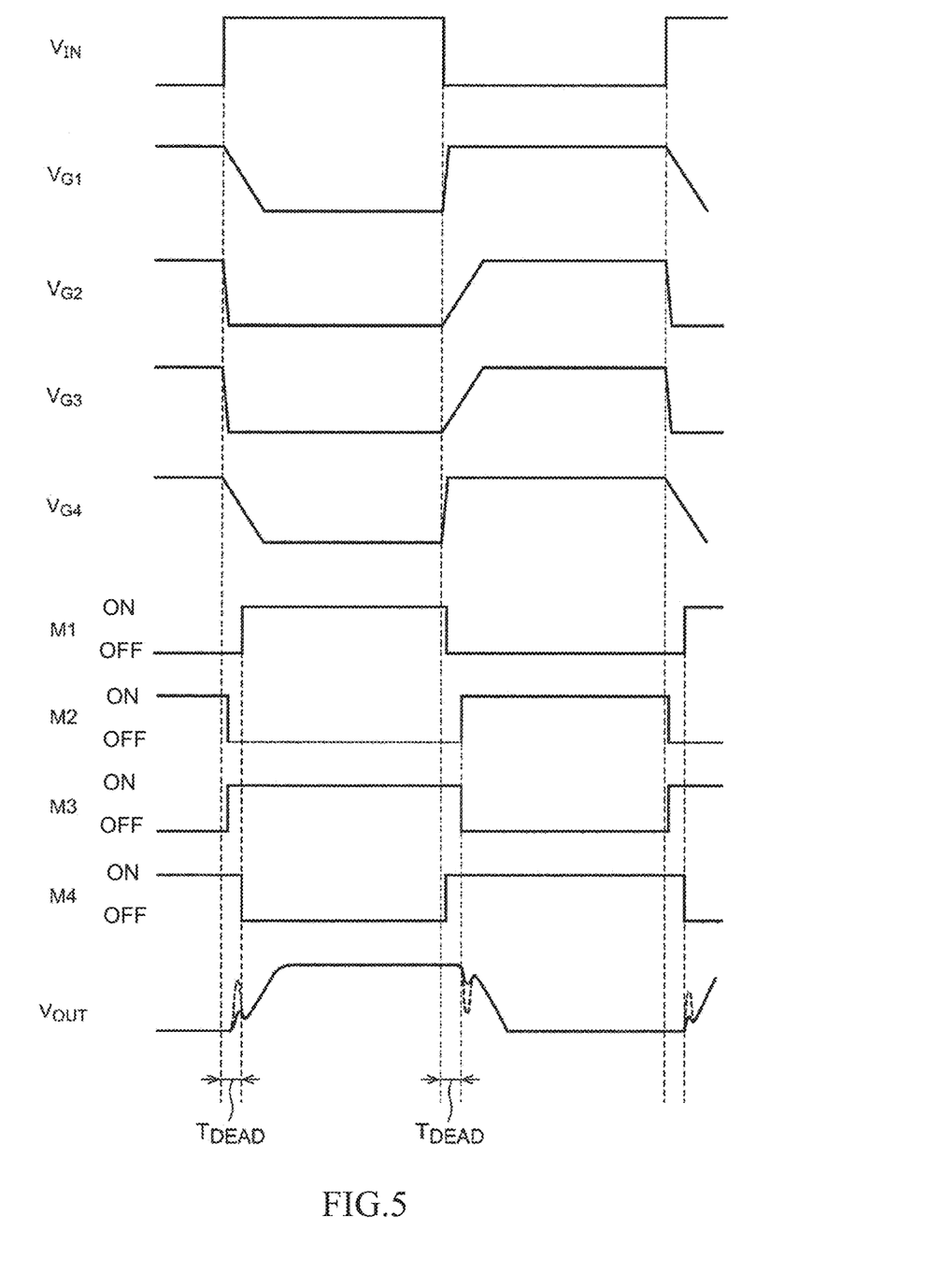
FIG. 5 is a timing diagram of the operation of the driving circuit in FIG. 4.

The configuration of the driving circuit 300 is as described above. The operation of the driving circuit 300 is to be explained below. FIG. 5 shows a timing diagram of the operation of the driving circuit 300 in FIG. 4.

For better understanding, the operation of the driving circuit 300 is explained, with the third transistor M3 and the fourth transistor M4 being omitted.

The turning on operation of the switching transistor 102 is first to be discussed. The turning on of the switching transistor 102 is generated by using conversion of the input voltage VIN from low to high as trigger. The negative edge of the first gate signal VG1 is more gradual that the positive edge thereof. Thus, the turn-on time of the first transistor M1 is increased, and the first transistor M1 becomes turned on in a moderate manner.

The turning off operation of the switching transistor 102 is discussed below. The turning off of the switching transistor 102 is generated by using conversion of the input voltage VIN from high to low as trigger. The positive edge of the second gate signal VG2 is more gradual than the negative edge thereof. Thus, the turn-on time of the second transistor M2 is increased, and the second transistor M2 becomes turned on in a moderate manner.

Figure 6:
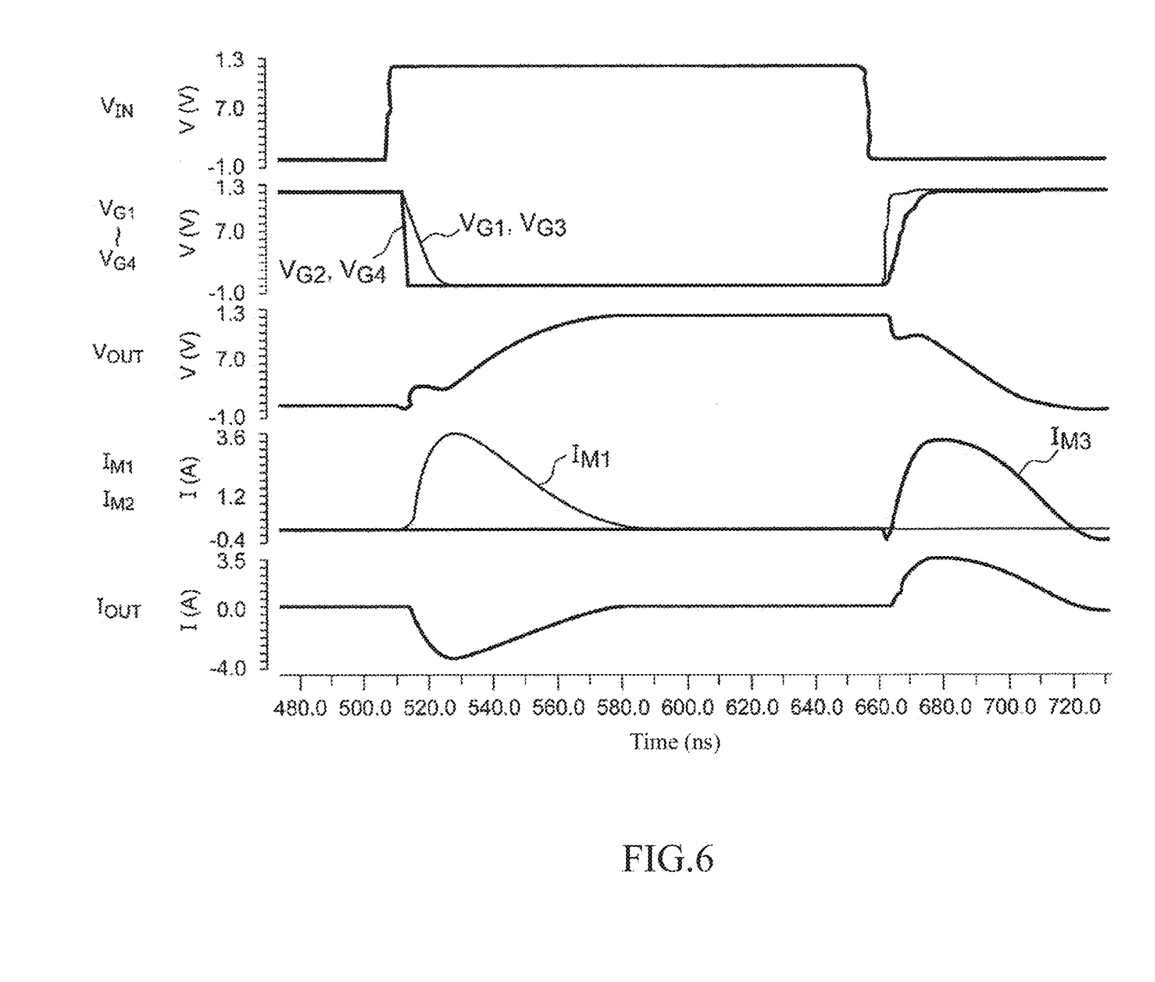
FIG. 6 is a simulated waveform diagram of the operation of the driving circuit in FIG. 4.

FIG. 6 shows a simulated waveform diagram of the operation of the driving circuit 300 in FIG. 4. Because the first transistor M1 is turned on moderately, the current IM1 flowing into the first transistor M1, that is, a current iOUT that charges the gate capacitor Cgs of the switching transistor 102, changes moderately compared to a situation where the first transistor M1 is turned on by a shorter turn-on time.

A counter electromotive force (EMF) generated in the parasitic inductances Lpcb1 and Lpcb2 is represented by the following equation:

$$VPEAK=(Lpcb1+Lpbc2)\cdot diOUT/dt$$

The counter EMF VPEAK causes the output VOUT to change sharply when the counter EMF VPEAK overlaps with the gate-source voltage VGS. In the driving circuit 300 in FIG. 4, by suppressing the slope of the output current iOUT while the switching transistor 102 is turned on, the counter EMF VPEAK generated in the parasitic inductances may be suppressed, hence further suppressing the output voltage VOUT from changing sharply.

Similarly, because the second transistor M2 is turned on moderately, the current IM2 flowing into the second transistor M2, that is, the current iOUT about to discharge the gate capacitor Cgs of the switching transistor 102, changes moderately compared to a situation where the second transistor M2 is turned on abruptly. Eventually, even if the switching transistor 102 is turned off, the output voltage VOUT may be suppressed from changing sharply.

Again referring to FIG. 5, the turning on of the first transistor M1 and the second transistor M2 is delayed, and a dead time TDEAD in which both of them are turned off is generated. It is acknowledged that the following issues arise as a result of the dead time.

Figure 7:
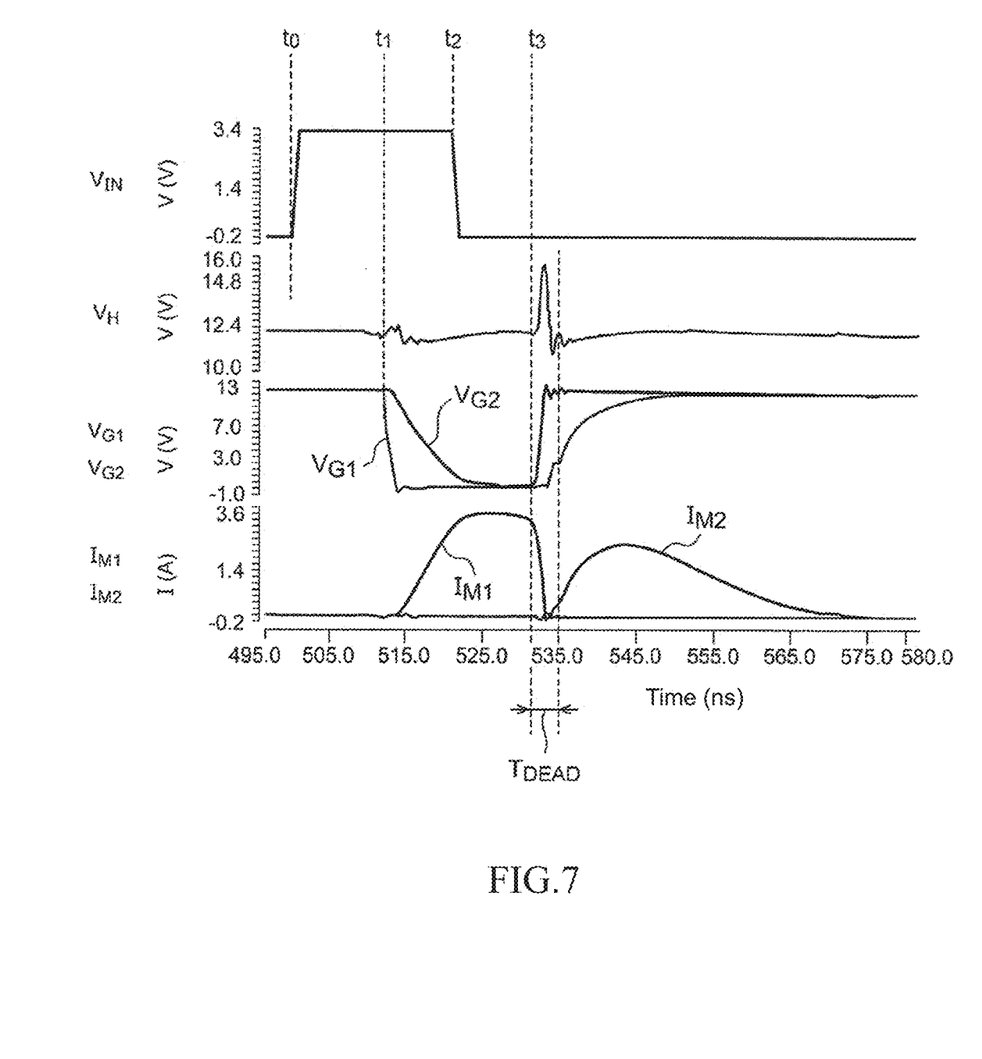
FIG. 7 is a simulated waveform diagram of inputting an input signal having a larger pulse width into a circuit in which a third transistor and a fourth transistor in a driving circuit are constantly turned off.

The issues resulted by the dead time are described with reference to FIG. 7. FIG. 7 shows a simulated waveform diagram when an input signal VIN having an extremely small duty cycle is inputted to a circuit in which the third transistor M3 and the fourth transistor M4 in the driving circuit 300 in FIG. 7 are constantly turned off.

At a timing t0, the input voltage VIN changes to high. At a timing t1 after a delay time from the timing t0 has elapsed, the first gate signal VG1 and the second gate signal VG2 change to low. As described above, because the first gate signal VG1 drops steeply, the first transistor M1 is turned on instantaneously. Once the first transistor M1 is turned on, the current IM1 flows from the capacitor 104 into the first transistor M1 and is provided to the gate of the switching transistor 102 to charge the gate capacitor Cgs.

At a timing t2, the input voltage VIN changes to low. At a timing t3 after a delay time from the timing t2 has elapsed, the first gate signal VG1 changes to high, and the first transistor M1 is immediately turned off and enters the dead time. When the input signal VIN has a smaller pulse width, before the gate capacitor Cgs is completely charged, that is, while the current IM flows into the first transistor M1, the first transistor M1 is turned off, and the current IM1 is drastically decreased. Since the current IM1 is provided by the parasitic inductances Lpcb3 and Lwire1 through the capacitor 104 in FIG. 4, a counter EMF directly proportional to the slope dIM1/dt of the current IM1 is generated in the parasitic inductances Lpcb3 and Lwire1. By overlapping the counter EMF with the voltage of the capacitor 104, the voltage VH of the high-side line 304 sharply changes, which is not a desirable situation.

The same issues are caused when the input signal VIN having a duty cycle approximating 100% is inputted to a circuit in which the third transistor M3 and the fourth transistor M4 in the driving circuit 300 are constantly turned off. More specifically, because the second transistor M2 is turned off while the current IM2 flows into the second transistor M2, a counter EMF is generated in parasitic inductances Lwire3 and Lpcb3, and hence the voltage VL of the low-side line 306 changes sharply.

Figure 8:
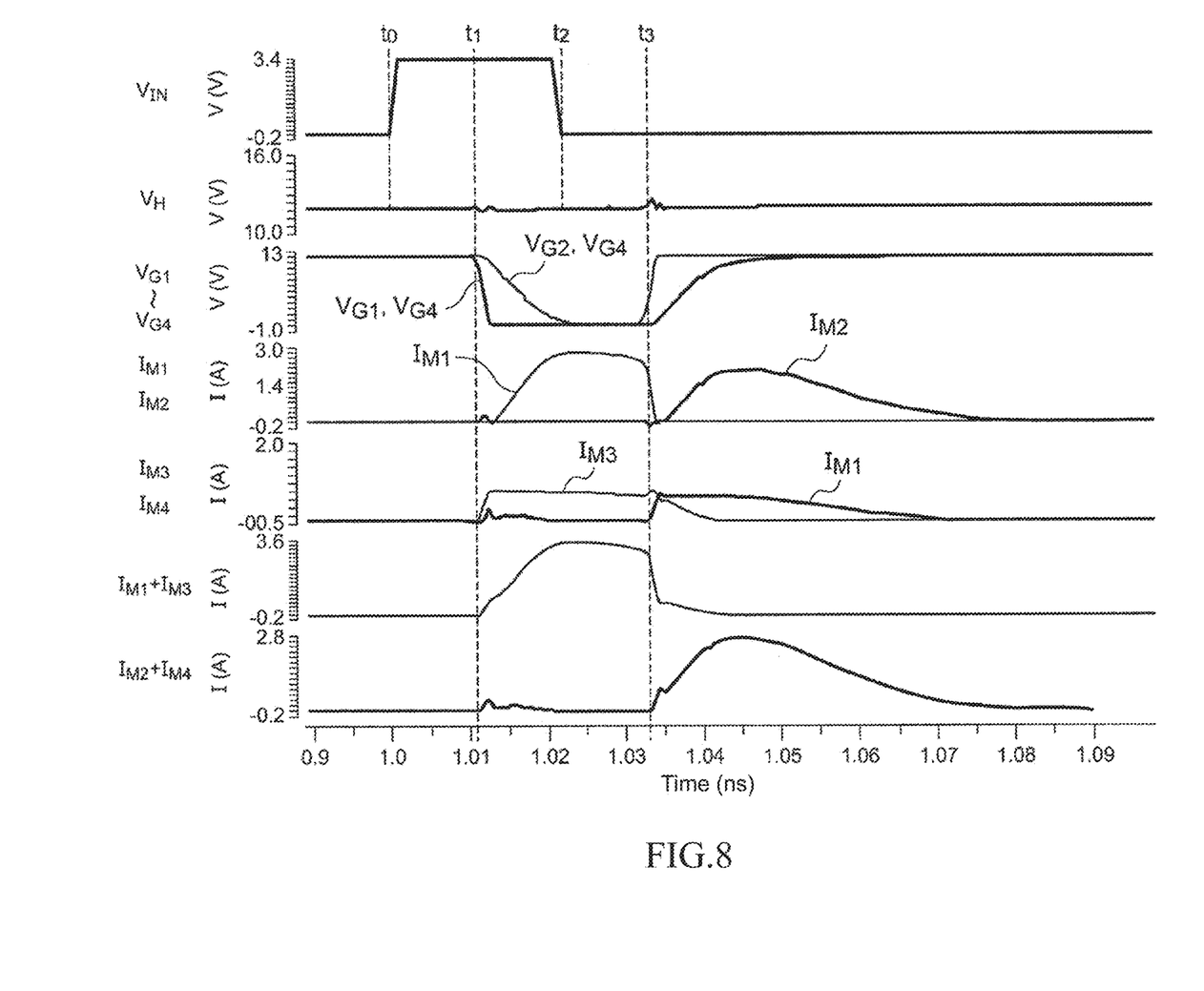
FIG. 8 is a simulated waveform diagram of the driving circuit in FIG. 4.

These issues are resolved by providing the third transistor M3 and the fourth transistor M4 in the driving circuit 300 in FIG. 4. FIG. 8 shows a simulated waveform diagram of the driving circuit 300 in FIG. 4.

At the timing t0, the input voltage VIN changes to high. At the timing t1 after a delay time from t0 has elapsed, the first gate signal VG1 to the fourth gate signal VG4 change to low. As described above, due to the steep drop of the first gate signal VG1, the first transistor M1 is turned on instantaneously. Once the first transistor M1 is turned on, the current IM1 flows from the capacitor 104 into the first transistor M1 and is provided to the gate of the switching transistor 102 to charge the gate capacitor Cgs. The third transistor M3 is turned on before the first transistor M1, and provides a current IM3 to the gate of the switching transistor 102. However, because the third transistor M3 has a size smaller than that of the first transistor M1, IM3<IM1.

At the timing t2, the input voltage VIN changes to low. At the timing t3 after a delay time from the timing t2 has elapsed, the first gate signal VG1 changes to high, and the first transistor M1 is turned off immediately and enters a dead time.

At this point, a combined current IM1+IM3 including the current IM1 flowing into the first transistor M1 and the current IM3 of the third transistor M3 flows into the parasitic inductances Lpcb3 and Lwire1. At the timing t3, the current IM1 of the first transistor M1 is decreased drastically but the current IM3 of the third transistor M3 is decreased moderately, and thus the slope of the combined current IM1+IM3 is smaller than the slope of the current IM1 in FIG. 7. Accordingly, the voltage VH of the high-side line 304 may be suppressed from changing sharply.

Further, after the timing t3, the fourth transistor M4 is turned on before the second transistor M2, and it then should be noted that the current IM1+IM3 flowing into the first transistor M1 and the second transistor M2 serves as a through current that flows into the fourth transistor M4. Although a through current is usually avoided in a common switching current, the through current is intentionally adopted in this embodiment to suppress changes in voltage. However, due to the reduced sizes of the third transistor and the fourth transistor, a through current as large as that when the first transistor M1 and the second transistor M2 are simultaneously turned on is not provided.

Even if when the duty cycle of the input voltage VIN is approximates 100%, the driving circuit 300 similarly operates, and thus sharp noises in the voltage VL of the low-side line 306 may be suppressed.

Figure 9:
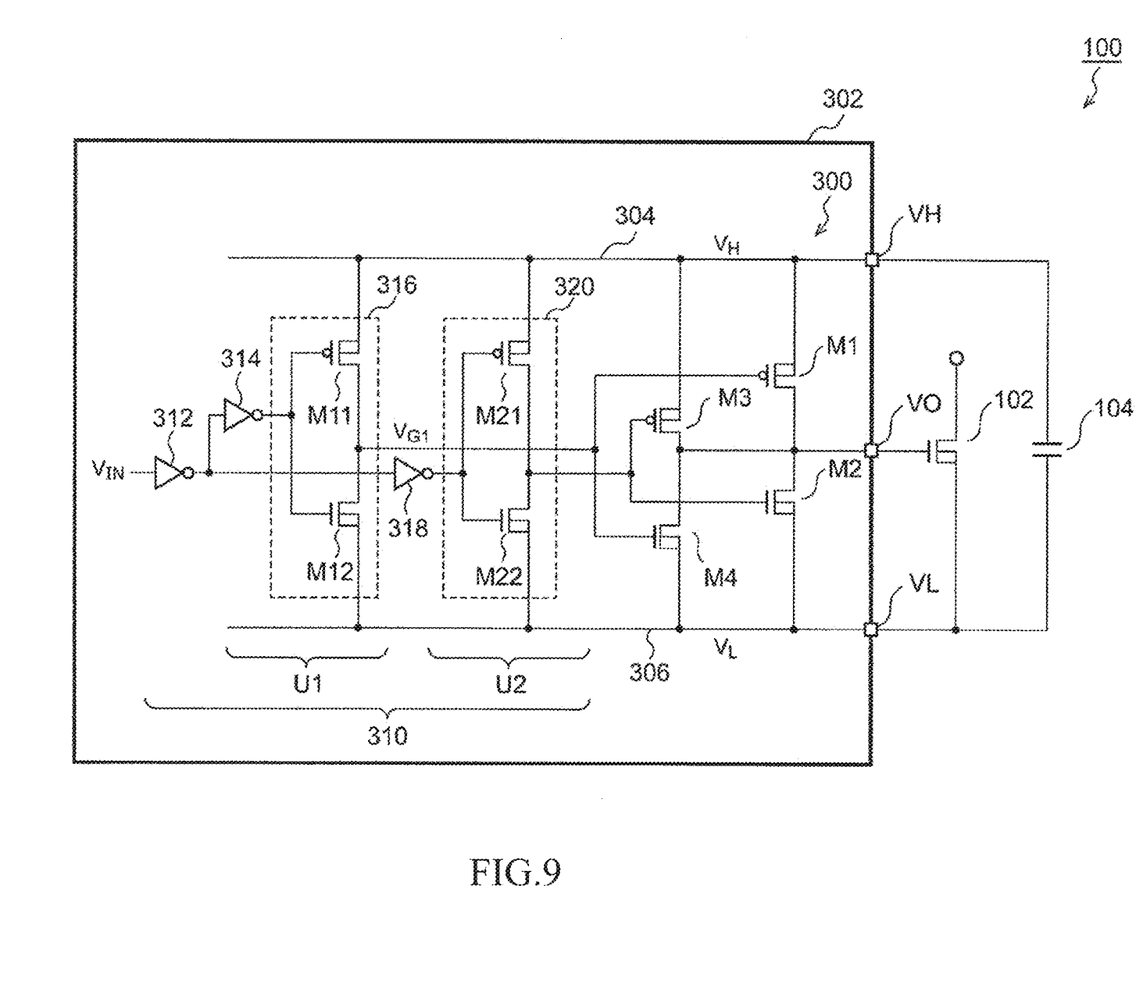
FIG. 9 is a circuit diagram of a configuration example of a pre-driver.

FIG. 9 shows a circuit diagram of a configuration example of the pre-driver 310. The pre-driver 310 includes an inverter 312, a first driving unit U1 and a second driving unit U2. The first driving unit U1 generates the first gate signal VG1. The gate signal VG1 is also provided to the gate of the fourth transistor M4. The first driving unit U1 includes an inverter 314, and a first complementary metal-oxide-semiconductor (CMOS) inverter 316 of an output section. The first CMOS inverter 316 is designed such that the capability (turn-on resistance) of a p-channel metal-oxide-semiconductor (PMOS) transistor M11 is higher (smaller) than the capability (turn-on resistance) of an n-channel metal-oxide-semiconductor (NMOS) transistor M12.

The second driving unit U2 generates the second gate signal VG2. The gate signal VG2 is also provided to the gate of the third transistor M3. The second driving unit U2 includes an inverter 318 and a second CMOS inverter 320 of an output section. The second CMOS inverter 320 is designed such that the capability (turn-on resistance) of a PMOS transistor M21 is lower (larger) than the capability (turn-on resistance) of an NMOS transistor M22.

The present invention is described by way of the embodiments above. The embodiments are examples, and a person skilled in the art should understand that there are numerous variation embodiments from combinations of these constituent elements and processes. Further, such variation embodiments are to be encompassed within the scope of the present invention. Some variation embodiments are described below.

Variation Example 1

Figure 10:
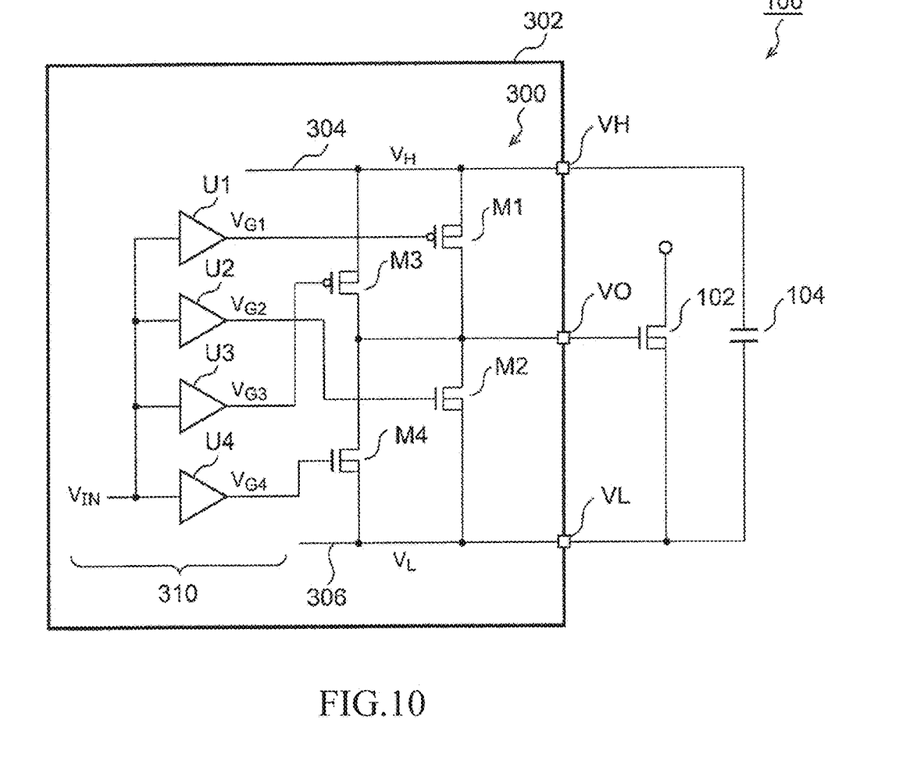
FIG. 10 is a circuit diagram of a driving circuit of a variation example.

In the description given so far, the first gate signal VG1 and the fourth gate signal VG4 are designed to be common, and the second gate signal VG2 and the third gate signal VG3 are designed to be common. However, these signal may also be generated individually. FIG. 10 shows a circuit diagram of a variation example. In this variation example, the pre-driver 310 includes a first driving unit U1 to a fourth driving unit U4. The first driving unit U1 to the fourth driving unit U4 respectively generate the first gate signal VG1 to the fourth gate signal VG4. According to such configuration, the timings for turning on and turning off the transistors M1 to M4 may be individually optimized by providing individual driving units U1 to U4 in the transistors M1 to M4, respectively.

Variation Example 2

To provide non-uniform positive edge and negative edge slopes of gate signals, turn-on resistances of the transistors M11 and M12 (or transistors M21 and M22) in FIG. 1 are, for example but not limited to, optimized. For example, the capabilities of the transistors M11 and M12 may design to be equal, and a resistance is placed to the side of the transistor M12. The same applies to the sides of the transistors M21 and M22, that is, the capabilities of the two may designed to be equal, and a resistance is placed to the side of the transistor M21.

Variation Example 3

In FIG. 5, the positive edge slope of the fourth gate signal VG4 is larger than the negative edge slope, and the fourth transistor M4 is turned on before the second transistor M2; however, the present invention is not limited to these examples. Alternatively, the positive edge slope of the fourth gate signal VG4 may also be designed to be moderate, and the timing for turning on the fourth transistor M4 may be delayed.

Similarly, in FIG. 5, the negative edge slope of the third gate signal VG3 is larger than the positive edge slope, and the third transistor M3 is turned on before the first transistor M1; however, the present invention is not limited to these examples. Alternatively, the negative edge slope of the third gate signal VG3 may be designed to be moderate, and the timing for turning on the third transistor M3 may be delayed.

(Purposes)

Figure 11:
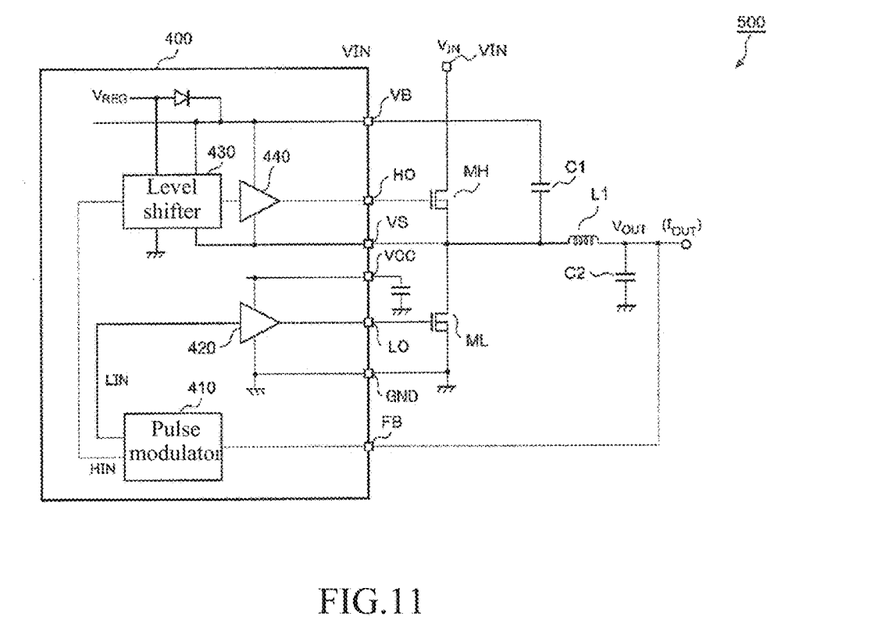
FIG. 11 is a circuit diagram of a controller of a direct-current (DC)/DC converter.

The purposes of the driving circuit 300 are described below. The driving circuit 300 may be used in a DC/DC converter. FIG. 11 shows a circuit diagram of a controller 400 of a DC/DC converter 500. The DC/DC converter 500 is a buck converter of synchronous rectification, and further includes capacitors C1 and C2 and an inductor L1 in addition to the controller 400.

The controller 400 includes a high-side transistor MH, a low-side transistor ML, a pulse modulator 410, a low-side driver 420, a level shifter 430, and a high-side driver 440. The pulse modulator 410 generates pulses signals HIN and LIN by way of rendering the output (output voltage or output current, or state of a load) of the DC/DC converter 500 to approximate a target. For example, the pulse modulator 410 may render the output voltage VOUT to approximate a target voltage VREF (constant voltage control), or the output current iOUT to approximate a target current IREF (constant current control).

The level shifter 430 shifts the level of the logic level pulse signal HIN. The high-side driver 440 drives the high-side transistor MH according to the level shifted pulse signal HIN. Further, the low-side driver 420 drives the low-side transistor ML according to the pulse signal LIN. The low-side driver 420 and the high-side driver 440 are formed on the basis of the architecture of the driving circuit 300 above.

Figure 12:
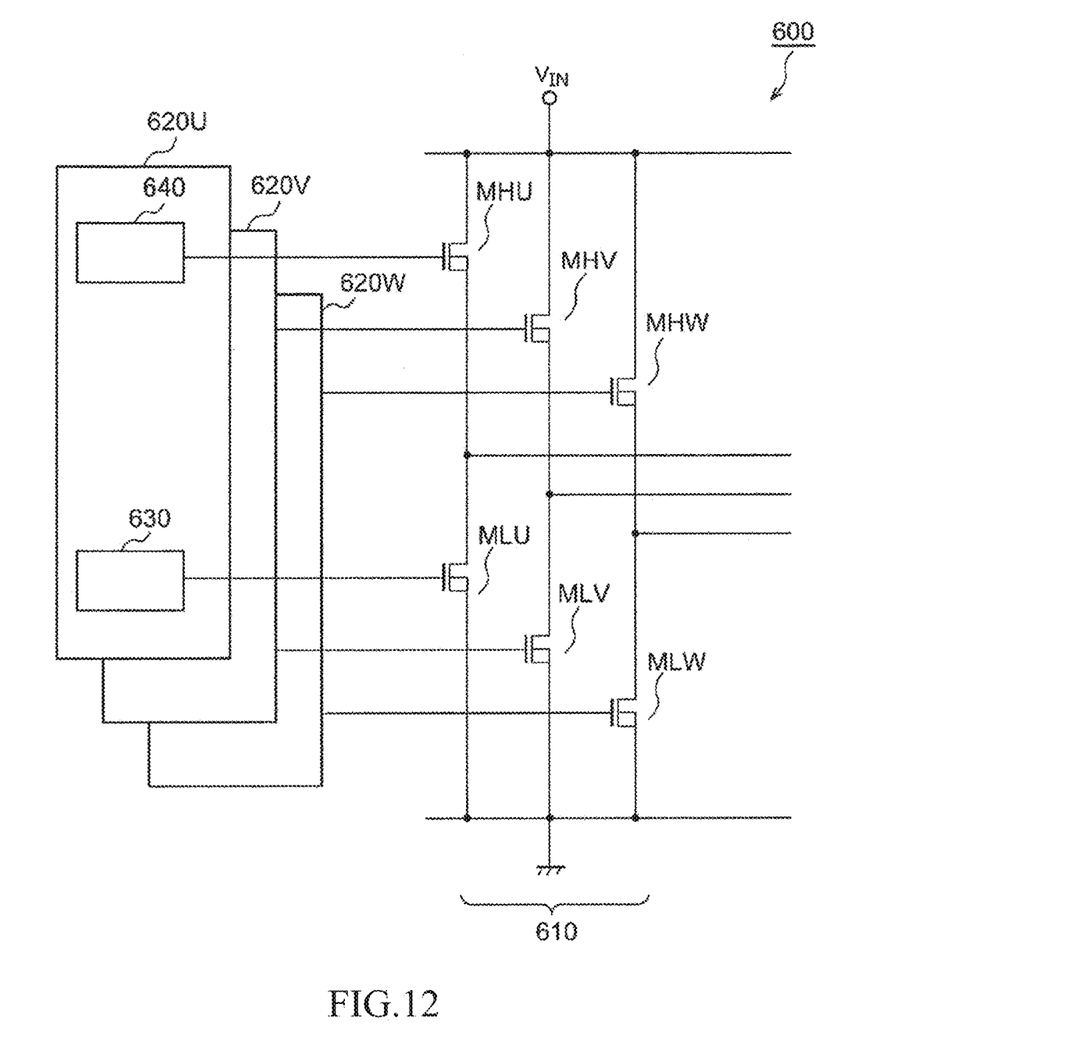
FIG. 12 is a circuit diagram of an inverter device including a driving circuit.

The driving circuit 300 may be used in an inverter device. FIG. 12 shows a circuit diagram of an inverter device 600 including the driving circuit 300. The inverter device 600 includes a three-phase inverter 610, and driving circuits 620U, 620V and 620W for a U phase, a V phase and a W phase. The three-phase inverter 610 includes high-side transistors MHU, MHV and MHW and low-side transistors MLU, MLV and MLW. The driving circuit 620# (where # is U, V or W) includes a high-side driver 640 and a low-side driver 630. The high-side driver 640 and the low-side driver 630 are formed on the basis of the architecture of the driving circuit 300 above.

The purposes of the switching circuit 100 are not limited to applications of the DC/DC converter or the inverter device. For example, the switching circuit 100 may also be applied in a converter converting an alternating-current voltage to a direct-current voltage, or a bidirectional converter mutually converting a direct-current voltage and an alternating-current voltage from one to the other, or a charging circuit of a battery.

The present invention has been described in terms of the embodiments above. However, these embodiments demonstrate merely principles and applications of the present invention. There are numerous variations embodiments and configuration modifications without departing from the scope of the concept of the present invention, as specified in the appended claims, are to be acknowledged.

What is claimed is:

1. A driving circuit of a switching transistor, comprising:
   an output pin, connected with a control terminal of the switching transistor;
   a high-side line;
   a low-side line;
   a p-channel first transistor, disposed between the high-side line and the output pin;
   an n-channel second transistor, disposed between the output pin and the low-side line;
   a p-channel third transistor, disposed between the high-side line and the output pin, having a size smaller than that of the first transistor;
   an n-channel fourth transistor, disposed between the output pin and the low-side line, having a size smaller than that of the second transistor; and
   a pre-driver, (i) providing a first gate signal to a gate of the first transistor, the first gate signal having a negative edge slope smaller than a positive edge slope, (ii)

providing a second gate signal to a gate of the second transistor, the second gate signal having a positive edge slope smaller than a negative edge slope, (iii) providing a third gate signal to a gate of the third transistor, the third gate signal having a positive edge slope smaller than the positive edge slope of the first gate signal, and (iv) providing a fourth gate signal to a gate of the fourth transistor, the fourth gate signal having a negative edge slope smaller than the negative edge slope of the second gate signal.

2. The driving circuit according to claim 1, wherein the negative edge slope of the third gate signal is larger than the positive edge slope thereof, and the positive edge slope of the fourth gate signal is larger than the negative edge slope thereof.

3. The driving circuit according to claim 2, wherein the first gate signal and the fourth gate signal are common, and the second gate signal and the third gate signal are common.

4. The driving circuit according to claim 3, wherein the pre-driver comprises:
  a first driving unit, receiving a pulse signal, generating the first gate signal using a first edge of the pulse signal as trigger to drop by a first slope and using a second edge of the pulse signal as trigger to rise by a second slope larger than the first slope; and
  a second driving unit, generating the second gate signal using the first edge of the pulse signal as trigger to drop by a third slope and using the second edge of the pulse signal as trigger to rise by a fourth slope smaller than the third slope.

5. The driving circuit according to claim 3, wherein the third transistor is smaller than ⅓ of the first transistor, and the fourth transistor is smaller than ⅓ of the second transistor.

6. The driving circuit according to claim 2, wherein the pre-driver comprises:
  a first driving unit, receiving a pulse signal, generating the first gate signal using a first edge of the pulse signal as trigger to drop by a first slope and using a second edge of the pulse signal as trigger to rise by a second slope larger than the first slope; and
  a second driving unit, generating the second gate signal using the first edge of the pulse signal as trigger drop by a third slope and using the second edge of the pulse signal as trigger to rise by a fourth slope smaller than the third slope.

7. The driving circuit according to claim 2, wherein the third transistor is smaller than ⅓ of the first transistor, and the fourth transistor is smaller than ⅓ of the second transistor.

8. The driving circuit according to claim 2, wherein the pre-driver comprises:
  a first driving unit, generating the first gate signal;
  a second driving unit, generating the second gate signal;
  a third driving unit, generating the third gate signal; and
  a fourth driving unit, generating the fourth gate signal.

9. The driving circuit according to claim 1, wherein the first gate signal and the fourth gate signal are common, and the second gate signal and the third gate signal are common.

10. The driving circuit according to claim 9, wherein the pre-driver comprises:
  a first driving unit, receiving a pulse signal, generating the first gate signal using a first edge of the pulse signal as trigger to drop by a first slope and using a second edge of the pulse signal as trigger to rise by a second slope larger than the first slope; and
  a second driving unit, generating the second gate signal using the first edge of the pulse signal as trigger to drop by a third slope and using the second edge of the pulse signal as trigger to rise by a fourth slope smaller than the third slope.

11. The driving circuit according to claim 9, wherein the third transistor is smaller than ⅓ of the first transistor, and the fourth transistor is smaller than ⅓ of the second transistor.

12. The driving circuit according to claim 1, wherein the pre-driver comprises:
  a first driving unit, receiving a pulse signal, generating the first gate signal using a first edge of the pulse signal as trigger to drop by a first slope and using a second edge of the pulse signal as trigger to rise by a second slope larger than the first slope; and
  a second driving unit, generating the second gate signal using the first edge of the pulse signal as trigger to drop by a third slope and using the second edge of the pulse signal as trigger to rise by a fourth slope smaller than the third slope.

13. The driving circuit according to claim 12, wherein the first driving unit comprises a first complementary metal-oxide-semiconductor (CMOS) inverter disposed at an output section thereof, and a p-channel metal-oxide-semiconductor (PMOS) transistor of the first CMOS inverter has a transistor size larger than that of an n-channel metal-oxide-semiconductor (NMOS) transistor of the first CMOS transistor; and
  the second driving unit comprises a second CMOS inverter disposed on an output section thereof, and a PMOS transistor of the second CMOS inverter has a transistor size smaller than that of an NMOS transistor of the second CMOS inverter.

14. The driving circuit according to claim 1, wherein the third transistor is smaller than ⅓ of the first transistor, and the fourth transistor is smaller than ⅓ of the second transistor.

15. The driving circuit according to claim 1, wherein the pre-driver comprises:
  a first driving unit, generating the first gate signal;
  a second driving unit, generating the second gate signal;
  a third driving unit, generating the third gate signal; and
  a fourth driving unit, generating the fourth gate signal.

16. A driving circuit of a switching transistor, comprising:
  an output pin, connected to a control terminal of the switching transistor;
  a high-side line;
  a low-side line;
  a p-channel first transistor, disposed between the high-side line and the output pin;
  an n-channel second transistor, disposed between the output pin and the low-side line;
  a p-channel third transistor, disposed between the high-side line and the output pin, having a size smaller than that of the first transistor;
  an n-channel fourth transistor, disposed between the output pin and the low-side line, having a size smaller than that of the second transistor; and
  a pre-driver, providing a first gate signal, a second gate signal, a third gate signal and a fourth gate signal to gates of the first transistor, the second transistor, the third transistor and the fourth transistor;
  wherein, the pre-driver generates the first gate signal by way of controlling a turn-on time of the first transistor to be longer than a turn-off time thereof, generates the second gate signal by way of controlling a turn-on time of the second transistor to be longer than a turn-off time thereof, and generates the third gate signal and the fourth gate signal by way of turning on the third transistor and the fourth transistor in a period which both the first transistor and the second transistor are turned off.

17. The driving circuit according to claim 16, wherein the first gate signal and the fourth gate signal are common, and the second gate signal and the third gate signal are common.

18. The driving circuit according to claim 17, wherein the pre-driver comprises:
   a first driving unit, receiving a pulse signal, generating the first gate signal using a first edge of the pulse signal as trigger to drop by a first slope and using a second edge of the pulse signal as trigger to rise by a second slope larger than the first slope; and
   a second driving unit, generating the second gate signal using the first edge of the pulse signal as trigger to drop by a third slope and using the second edge of the pulse signal as trigger to rise by a fourth slope smaller than the third slope.

19. The driving circuit according to claim 16, wherein the pre-driver comprises:
   a first driving unit, receiving a pulse signal, generating the first gate signal using a first edge of the pulse signal as trigger to drop by a first slope and using a second edge of the pulse signal as trigger to rise by a second slope larger than the first slope; and
   a second driving unit, generating the second gate signal using the first edge of the pulse signal as trigger to drop by a third slope and using the second edge of the pulse signal as trigger to rise by a fourth slope smaller than the third slope.

20. The driving circuit according to claim 16, wherein the third transistor is smaller than $1/3$ of the first transistor, and the fourth transistor is smaller than $1/3$ of the second transistor.

* * * * *